United States Patent
Dawes et al.

(10) Patent No.: US 8,974,897 B2
(45) Date of Patent: Mar. 10, 2015

(54) REFRACTORY VESSELS AND METHODS FOR FORMING SAME

(71) Applicant: Corning Incorporated, Corning, NY (US)

(72) Inventors: Steven Bruce Dawes, Corning, NY (US); Douglas Hull Jennings, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 14/215,762

(22) Filed: Mar. 17, 2014

(65) Prior Publication Data

US 2014/0199506 A1 Jul. 17, 2014

Related U.S. Application Data

(62) Division of application No. 13/307,031, filed on Nov. 30, 2011, now Pat. No. 8,713,966.

(51) Int. Cl.
| | |
|---|---|
| *C03B 19/06* | (2006.01) |
| *C30B 35/00* | (2006.01) |
| *C30B 11/00* | (2006.01) |
| *C30B 15/10* | (2006.01) |
| *C30B 28/06* | (2006.01) |
| *C30B 29/06* | (2006.01) |
| *C03B 19/09* | (2006.01) |

(52) U.S. Cl.
CPC ............. *C03B 19/066* (2013.01); *C30B 35/002* (2013.01); *C30B 11/002* (2013.01); *C30B 15/10* (2013.01); *C30B 28/06* (2013.01); *C30B 29/06* (2013.01); *C03B 19/09* (2013.01)
USPC .......................................... 428/218; 428/34.5

(58) Field of Classification Search
CPC ....... C03B 19/06; C03B 19/09; C03B 19/066; C03B 11/002; C03B 15/10; C03B 28/06; C03B 29/06; C03B 35/002
USPC .................................................. 428/218, 315
See application file for complete search history.

(56) References Cited

U.S. PATENT DOCUMENTS

| | | | |
|---|---|---|---|
| 6,672,107 B2 * | 1/2004 | Werdecker et al. | ............ 65/17.4 |
| 2003/0041623 A1 * | 3/2003 | Werdecker et al. | ............ 65/17.6 |

* cited by examiner

*Primary Examiner* — Arti Singh-Pandey
(74) *Attorney, Agent, or Firm* — Michael W Russell (57) ABSTRACT

The disclosure relates to methods of forming a vessel and to the resulting vessel. The vessel may be formed by providing a first fumed silica soot layer comprised of primary particles of fumed silica soot, and then providing over the first fumed silica soot layer a second fumed silica soot layer comprised of agglomerated particles formed into an agglomerated form from primary particles of fumed silica soot. The primary particles of the first fumed silica soot layer may have a substantially uniform density distribution, and the agglomerated particles of the second fumed silica soot layer may have a substantially non-uniform density distribution. The methods may include consolidating the first and second soot layers together to form a consolidated body.

2 Claims, 7 Drawing Sheets

REFRACTORY VESSELS AND METHODS FOR FORMING SAME

This application is a divisional of U.S. patent application Ser. No. 13/307,031 filed on Nov. 30, 2011, the content of which is relied upon and incorporated herein by reference in its entirety, and the benefit of priority under 35 U.S.C. §120 is hereby claimed.

FIELD

The disclosure relates to methods of forming vessels, such as vessels configured to contain molten semiconducting materials. In certain embodiments, the vessels comprise a relatively high purity lining having relatively low porosity, and an insulating backer having higher porosity than that of the lining. In further embodiments the disclosure relates to methods of forming vessels from pre-consolidated soot layers having differing properties related to the macroporosity contained within each layer. Such vessels can be formed using a single consolidation step

BACKGROUND

The exocasting process can be used to form, for example, silicon photovoltaic substrates using a molten semiconducting material, such as molten silicon. A mold, such as one comprising refractory materials, may be dipped into and removed from the molten silicon to form a solidified layer of silicon on an exterior surface of the mold. The molten silicon is typically disposed within a vessel.

In various applications, it is desirable that the vessel used to hold the molten silicon be made from materials meeting particular exocasting requirements, such as high temperature stability and purity. By way of example, in at least some processes, the molten silicon is heated to temperatures of at least about 1412° C., and thus the vessel that contains the molten silicon is preferably made from a material that is able to withstand the high molten silicon temperature. In addition, in various embodiments, in order to form consistent silicon wafers without uneven surfaces, the crucibles can be made of a material of a sufficiently high purity so that impurities from the crucible do not contaminate the molten silicon. The vessel may also provide thermal insulation properties, for example, to maintain the silicon in a molten state.

The inventors have now discovered a process of making a unitary structure, such as a vessel for holding molten semiconducting material that is of sufficient temperature stability and purity, while also providing sufficient thermal insulating properties, for use in certain applications, such as various methods of making articles of semiconducting materials. It should be noted, however, that while the structures disclosed herein may have certain temperature stability, purity, and/or thermal insulating properties, as described, the temperature stability, purity, and/or thermal insulating properties of at least some embodiments may be present in a greater or lesser degree, or may not be present at all. However, such embodiments are intended to be within the scope of the disclosure.

The inventors have also discovered a process of making a vessel in the form of a unitary structure that may be formed from multiple structural layers, while minimizing the number of steps to form the layers, where the layers have sufficiently high purity and are sufficiently thermally insulating.

SUMMARY

In accordance with various exemplary embodiments of the disclosure are provided methods of forming a vessel. An example method comprises providing a first fumed silica soot layer comprised of primary particles of fumed silica soot, and a second fumed silica soot layer comprised of agglomerated particles formed into an agglomerated form from primary particles of fumed silica soot, which is provided over the first fumed silica soot layer. The primary particles of the first fumed silica soot layer may have a substantially uniform density distribution, while the agglomerated particles of the second fumed silica soot layer may have a substantially non-uniform density distribution. The method includes consolidating the first and second soot layers together to form a consolidated structure.

According to further methods, the first fumed silica soot may be modified by a process to form a second fumed silica soot layer comprised of agglomerated particles formed into an agglomerated form from primary particles of fumed silica soot.

Exemplary embodiments also relate to a consolidated structure having a first fused silica soot layer having a density ranging from about 2.18 g/cm$^3$ to 2.22 g/cm$^3$, and a second fused silica soot layer bonded to the first fused silica soot layer and having a density ranging from about 1.65 g/cm$^3$ to 2.15 g/cm$^3$. By way of example, the consolidated structure may have a first fused silica soot layer having a density of 2.2 g/cm$^3$, and a second fused silica soot layer having a density of 1.8 g/cm$^3$ bonded to the first fused silica soot layer.

Exemplary embodiments of the disclosure also relate to a compacted structure having a first fumed silica soot layer and a second fumed silica soot layer. The first fumed silica soot layer may be comprised of primary particles of fumed silica soot and may be compacted from an initial density ranging from about 0.1 g/cm$^3$ to 0.4 g/cm$^3$, to a pressed density ranging from about 0.6 g/cm$^3$ to 1.2 g/cm$^3$. The second fumed silica soot layer may be comprised of agglomerated particles of fumed silica soot formed into an agglomerated form from primary particles of fumed silica soot, and may be compacted from a modified tap density ranging from about 0.35 g/cm$^3$ to 0.9 g/cm$^3$ to a pressed density ranging from about 0.6 g/cm$^3$ to 1.2 g/cm$^3$. The second fumed silica soot layer can be formed over the first fumed silica soot layer. The primary particles of the first fumed silica soot layer may, in at least some embodiments, have a substantially uniform density distribution. The agglomerated particles of the second fumed silica soot layer may, in at least some embodiments, have a substantially non-uniform density distribution.

As used herein the terms "compacting," "compacted," and the like refer to two physically distinct layers, such as a first layer of fumed silica soot and a second layer of fumed silica soot, which are combined into a single composite structure such as, for example, by an act of pressing the particles to increase particle packing density. In various embodiments, each of the first layer and the second layer may have the same, substantially the same, or different distributions of primary and secondary particles.

As used herein, the terms "consolidated," "consolidating," and the like, refer to an act of transforming a compacted structure from a fumed silica structure to a fused silica structure, such as by thermal treatment. Examples of consolidating include heating the materials by, for example, a sintering process, to cause the two or more layers to bond together into a single structure.

As used herein, the phrase "tap density" refers to the ratio of mass to volume of a free flowing soot powder after settling by vibrating or tapping a container holding the soot powder until no additional settling occurs.

As used herein, the phrase "pressed density" is the density of a layer of soot following compaction or pressing of the soot layer due to a supply of pressure to the soot layer.

As used herein, the phrase "agglomerated soot" refers to fumed silica soot that has been treated by a process that induces formation of a distribution of larger agglomerated secondary particles, comprised of primary soot particles. The agglomerated soot is characterized by weak attractive force between the primary particles, such as by Van der Waals, forces, meniscus forces (e.g., water surface tension), or electrostatic forces. The agglomerated secondary particles can be returned to the original fumed silica state, for example by high impact powder milling or other dispersive methods.

As used herein, the phrase "compaction distance" refers to a distance within a given area that a specific amount of fumed silica soot is compacted from an initial, un-compacted level to a final, compacted level of the fumed silica soot. The compaction distance may be used to provide a real time calculation of the soot volume and density after compaction.

As used herein, the phrase "unitary structure" means a structure formed from multiple structure layers which are combined to form a single structure.

As used herein, the phrase "formed over" with regard to layers of fumed silica soot is intended to mean that one layer of fumed silica soot is provided, and subsequently at least one additional layer of fumed silica soot is provided in contact with the first layer.

As used herein, the term "silica soot" is intended to include a soot that is substantially comprised of silica, such as, for example, greater than about 50% by weight, such as greater than about 75% by weight, greater than about 85% by weight, greater than about 90% by weight, greater than about 95% by weight, greater than about 97% by weight, greater than about 98% by weight, or greater than about 99% by weight silica. As described herein, it is intended that each of the first and second layers of silica soot may comprise the same, substantially the same, or different purities of silica. It is within the ability of those skilled in the art to choose the purity of silica soot appropriate for each layer, depending on the desired application and properties.

As used herein, the term "fumed silica soot" is intended to mean a silica powder generated by combustion of a silica precursor, and collected as a free-flowing powder. Fumed silica soot may, in at least some embodiments, be characterized by an average particle size ranging from about 0.25 microns or less, and an average surface area ranging from about 10 $m^2/g$ to 100 $m^2/g$.

In various embodiments, the silica precursor may be chosen from, but is not limited to, one or more of silicon tetrachloride ($SiCl_4$), octamethyl cyclotetrasiloxane ($Si_4O_4C_8H_{24}$), and other silicones, and silicon ethoxide ($Si(OC_2H_5)_4$) and other alkoxides. By way of example only, a chlorine treatment may be performed, and may provide a purity of fumed silica soot of up to 99.9999%.

Additional objects and advantages of the disclosure will be set forth in part in the description which follows, and in part will be obvious from the description, or may be learned by practice of the disclosure. The objects and advantages of the disclosure will be realized and attained by means of the elements and combinations particularly pointed out in the appended claims.

It is to be understood that both the foregoing general description and the following detailed description are exemplary and explanatory only and are not restrictive of the claims. Other embodiments will be apparent to those skilled in the art from consideration of the specification and practice of the embodiments disclosed herein.

The accompanying drawings, which are incorporated in and constitute a part of this specification, illustrate exemplary embodiments of the disclosure and, together with the description, serve to explain the principles described herein.

DETAILED DESCRIPTION

In various exemplary embodiments of the disclosure are provided methods of forming a unitary structure, such as a vessel, as well as the resulting unitary structure. In various embodiments, the methods comprise providing a first fumed silica soot layer comprised of primary particles of fumed silica soot, and a second fumed silica soot layer comprised of agglomerated particles formed into an agglomerated form from primary particles of fumed silica soot that is provided over the first fumed silica soot layer. The primary particles of the first fumed silica soot layer may have a substantially uniform density distribution, and the agglomerated particles of the second fumed silica soot layer may have a substantially non-uniform density distribution. The methods include, in various embodiments, consolidating the first and second fumed silica soot layers together to form a consolidated unitary structure.

In at least one exemplary embodiment, the method of forming the unitary structure includes, for example, providing a first fumed silica soot layer comprised of primary particles of fumed silica soot, the primary particles optionally having a substantially uniform density distribution. The exemplary method includes modifying primary particles of fumed silica soot by a process to form agglomerated particles of fumed silica soot, and providing a second fumed silica soot layer comprised of agglomerated particles of fumed silica soot, such as directly in contact with the first fumed silica soot layer. The agglomerated particles of the second fumed silica soot layer may have a substantially non-uniform density distribution. In various embodiments, the methods further comprise compacting the first fumed silica soot layer and the second fumed silica soot layer into a compacted structure, and then consolidating the first and second soot layers of the compacted structure to form a consolidated structure.

Figure 1A:
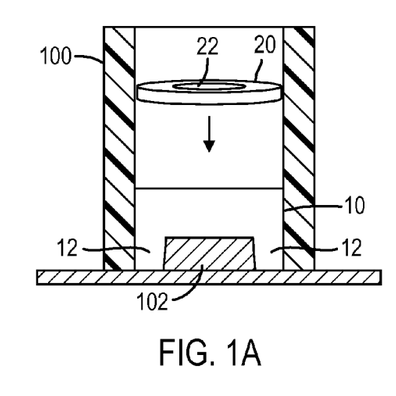
FIGS. 1A-H illustrate a method of forming a vessel according to at least one exemplary embodiment of the disclosure.

FIGS. 1A-H illustrates an exemplary method of forming a unitary structure, such as a vessel, according to at least one exemplary embodiment of the disclosure. The vessel may be configured to receive molten material, such as, for example, molten semiconducting material used in the formation of solidified articles of semiconducting material. In FIG. 1A, a first fumed silica soot layer 10 is provided. The first fumed silica soot layer 10 may be an as-formed soot having submicron primary particles. The first fumed silica soot layer 10 may optionally have one or a combination of the following properties: (a) an average particle size of about 0.25 microns or less, and (b) an average surface area ranging from about 10 $m^2/g$ to 100 $m^2/g$. FIG. 2 is an image, at 25,000×, of the fumed silica soot used in the first soot layer 10 or used in a second soot layer, which will be discussed further below, in a pre-compacted, unmodified state according to at least one exemplary embodiment. The fumed silica soot used in the layers, for example, the first soot layer 10, may have an initial, unmodified tap density ranging from about 0.1 $g/cm^3$ to 0.4 $g/cm^3$, such as, for example, about 0.3 $g/cm^3$.

As shown in the exemplary embodiment of FIG. 1A, the first fumed silica soot layer 10, which is in an unmodified state, may be provided within a mold, such as, for example, a first pressing mold 100 about a well mold 102 positioned within the first pressing mold 100. A first compacting device, such as a first ram 20, may be provided within the first pressing mold 100 and may pre-compact sidewalls 12 of the first fumed silica soot layer 10. The first ram 20 may include an opening 22 defined within a central portion of the first ram 20 so that only the sidewalls 12 are compacted. Thereafter, the first ram 20 may be retracted.

Figure 1B:
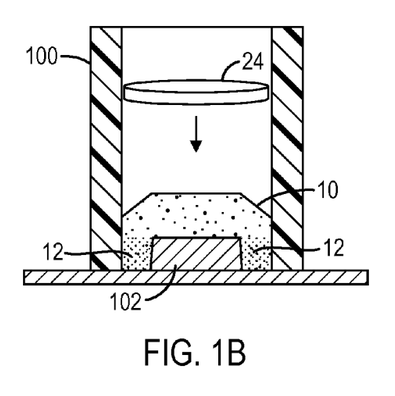
Figure 2:
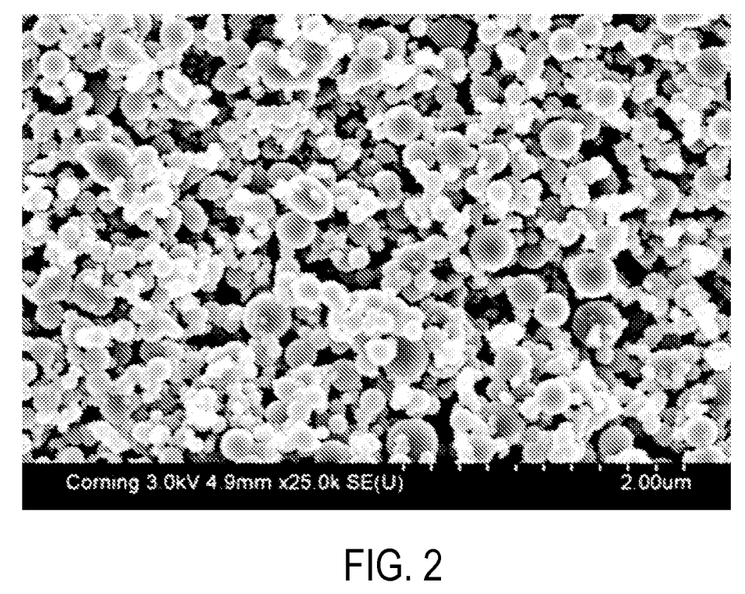
FIG. 2 is an SEM image of one of the layers of the structure in a pre-compacted, unprocessed state according to at least one exemplary embodiment.

As shown in FIG. 1B, due to the nature of the loose soot, the loose soot in the center redistributes across the well mold 102 and at least partially across the compacted sidewalls 12, and a second compacting device, which may be the same or different as the first compacting device, such as, for example, a ram 24, may be provided. The second compacting device may optionally be flat and may not include an opening therethrough, and may therefore compact the remaining loose soot to a desired pressed density, such as, for example, within a range from about 0.6 $g/cm^3$ to 1.2 $g/cm^3$.

The first fumed silica soot layer 10 may be compacted to a pressed density chosen based upon the desired application, and may be chosen relative to the density to which a second fumed silica soot layer is compacted, as will be described in more detail below. For example, the first fumed silica soot layer 10 may be compacted to a pressed density ranging from about 0.6 $g/cm^3$ to 1.2 $g/cm^3$. In addition, the first fumed silica soot layer 10 may be compacted at pressures ranging from, for example, about 200 psi to about 900 psi, as will be described in more detail below.

Figure 3:
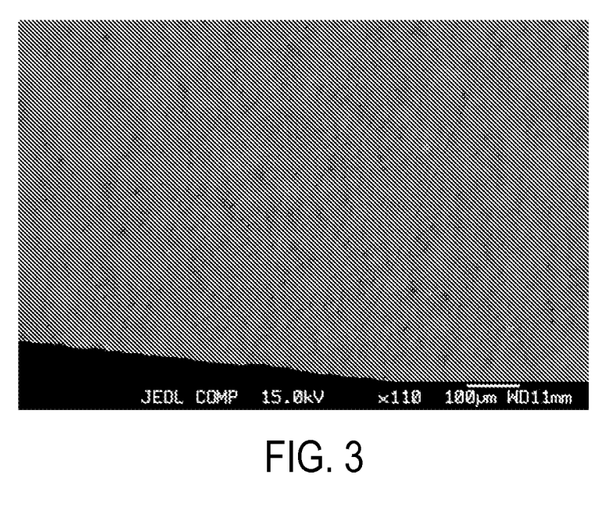
FIG. 3 is an SEM image of the layer shown in FIG. 2 in a compacted state.

FIG. 3 is an image of the first fumed silica soot layer of FIG. 2 in a compacted state, according to at least one exemplary embodiment, at a pressed density of 0.8 $g/cm^3$. As can be seen, in a compacted state, the first soot layer 10 has a highly uniform structure at the micron scale and has a substantially uniform pore structure at the sub-micron scale.

Figure 1C:
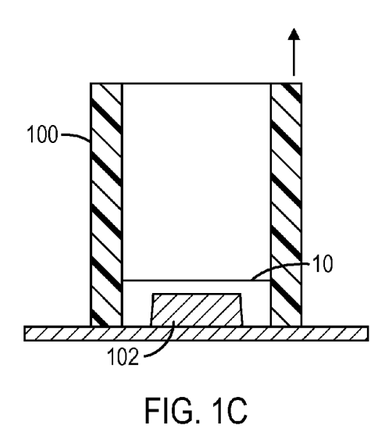
Figure 1D:
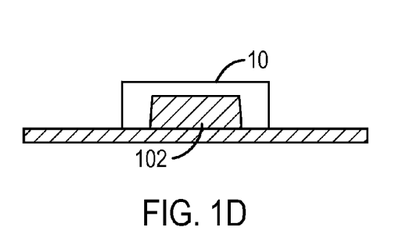

As shown in the exemplary embodiment of FIG. 1C, the second ram 24 may, in at least one embodiment, be retracted, and the first pressing mold 100 may be removed, such as by disassembly or retraction. The compacted first soot layer 10 remains about the well mold 102, as shown in FIG. 1D.

Figure 1E:
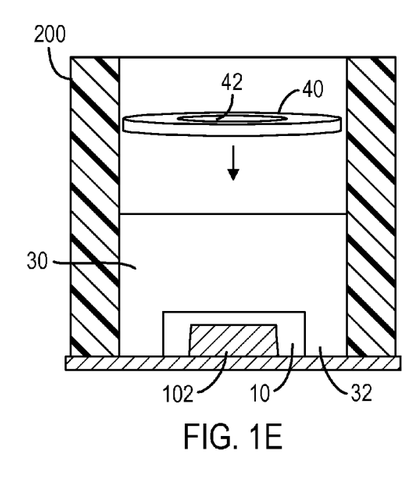

Thereafter, in a further exemplary embodiment such as shown in FIG. 1E, a second pressing mold 200 may be provided, and the well mold 102 with the compacted inner layer 10 surrounding the well mold 102 may be disposed within the second pressing mold 200. One or both of the first pressing mold 100 and the second pressing mold 200 may, in various embodiments, be made from a rigid material that has low adhesion to the compacted soot, such as, by way of example only, carbon, Teflon-lined aluminum, dense polyethylene, or silica. One or both of the first pressing mold 100 and the second pressing mold 200 may have a hollow geometrical tubular form. The first pressing mold 100 may, in various embodiments, have an inner circumferential area that is larger than the well mold 102. The second pressing mold 200 may, in various embodiments, have an inner circumferential area that is larger than the inner area of the first pressing mold 100.

An additional, second fumed silica soot layer 30 may be provided over the compacted first soot layer 10. The second fumed silica soot layer 30 may be treated by a process before being provided over the compacted first soot layer 10, in order to form a soot layer having substantially agglomerated particles. As-formed fumed silica soot, which may be the same as-formed fumed silica soot as the first fumed silica soot layer 10, can be used in the process which forms the soot layer having substantially agglomerated particles. The as-formed fumed silica soot may be comprised of primary soot particles having an average particle size of about 0.25 microns or less and an average surface area ranging from about 10 $m^2/g$ to 100 $m^2/g$.

The second fumed silica soot layer 30 can be modified using a process in order to form secondary agglomerated particles throughout the second layer 30 from the primary soot particles of the as-formed fumed silica soot. The second fumed silica soot layer 30 can be treated by a process, such as, by way of example only, dry milling (rolling), vibramilling, shaking/mixing, or spray-drying, which can induce formation of a distribution of the larger secondary agglomerated particles, which are comprised wholly of the primary soot particles. For example, mixing may be by a Turbula mixer.

The secondary agglomerated soot particles may be, for example, about 50 to 5000 times larger in diameter than the primary soot particles from which the secondary particles are formed. By way of example only, the primary particle size may be about 180 nm, while the secondary particles formed from the primary particles may be about 10 to 500 μm in diameter. The primary particles may be fully dense silica, whereas the secondary particles may have porosity and may have a density ranging between 0.8 $g/cm^3$ and 1.5 $g/cm^3$. As such, each secondary agglomerated particle may be comprised of between about $10^4$ and $10^{10}$ primary particles. The agglomerated soot may be further characterized by relatively weak attractive force between the primary soot particles. The agglomerated particles can be returned to the original fumed silica state, for example by high impact powder milling or other dispersive methods.

The secondary particles may possess a tap density that is higher than a tap density of the primary particles from which the secondary particles were made, and may also retain a high specific surface area. Specifically, an initial tap density of the second fumed silica soot layer 30, which is modified to form a soot layer having substantially agglomerated particles, is increased from a range of about 0.1 $g/cm^3$ to 0.4 $g/cm^3$, such as, for example, about 0.3 $g/cm^3$, to a modified tap density ranging from about 0.35 $g/cm^3$ to 0.9 $g/cm^3$.

The second fumed silica soot layer 30 may be processed before being provided within the second pressing mold 200 and prior to compaction of the second soot layer 30. The process for forming the agglomerated soot layer may occur by any method known to those of skill in the art, such as by, for example, dry milling (e.g., rolling), vibramilling, shaking/mixing, or spray-drying.

In at least one exemplary embodiment, fumed silica soot is treated by the process of dry milling, e.g., rolling, to form the agglomerated secondary soot particles. In an exemplary embodiment, the soot may be rolled in a container, such as a cylindrical container, for an appropriate period of time, such as, for example, up to about 24 hours, which allows cohesive forces between the primary particles to weakly bind the particles together to form the agglomerated particles. In milling, agglomerated particles are formed by the repeated contact between the particles. The agglomerated particles may be at least about 20 microns in diameter or greater, such as, for example, about 50 to 300 microns in diameter after rolling the fumed silica soot for about 24 hours. The average surface area of the modified soot may range from, for example, about 15 $m^2/g$ to 100 $m^2/g$, and may, in one exemplary embodiment, be about 23 $m^2/g$. The agglomerated particles may be formed into any shape, such as a generally oval shape, in the rolling process.

In at least one exemplary embodiment, the agglomerated particles may be formed by rolling the soot in a container, such as a Nalgene container, for 1 to 2 days.

In one exemplary embodiment, after rolling soot having a surface area of about 23 $m^2/g$ for about 24 hours, the tap density of the fumed silica soot can increase from an initial tap density ranging from about 0.1 $g/cm^3$ to 0.4 $g/cm^3$, such as about 0.3 $g/cm^3$, to a modified tap density ranging from about 0.3 $g/cm^3$ to 0.65 $g/cm^3$. The density of the individual agglomerate particles, after formation, can range from, for example, about 0.55 $g/cm^3$ to 0.9 $g/cm^3$.

In another exemplary embodiment, fumed silica soot is treated by a shaking/mixing process to form agglomerated secondary soot particles. In the process of shaking/mixing, the second fumed silica soot layer 30, as-formed soot is provided within, for example, a mixer such as a Turbula mixer, and the as-formed soot is processed to cause primary particles of the as-formed soot to bind together as agglomerated secondary particles. In an exemplary embodiment, the soot may be processed from, for example, about 8 to 24 hours to agglomerate the primary particles into secondary agglomerated particles due to the repeated contact between the primary particles. The agglomerated particles may be at least about 20 microns in diameter or greater, such as, for example, about 60 to 120 microns in diameter after shaking/mixing the fumed silica soot for about 24 hours. The average surface area of the modified soot may range from about 15 $m^2/g$ to 100 $m^2/g$, and may, in one exemplary embodiment, be about 23 $m^2/g$. The agglomerated particles may be formed into any shape, such as a generally spherical shape.

After shaking/mixing the soot having a surface area of about 23 $m^2/g$ for about 24 hours, the tap density of the fumed silica soot can increase from an initial tap density ranging from about 0.1 $g/cm^3$ to 0.4 $g/cm^3$, such as about 0.3 $g/cm^3$, to a modified tap density ranging from about 0.3 $g/cm^3$ to 0.65 $g/cm^3$. The density of the individual agglomerate particles, after formation, ranges from about 0.55 $g/cm^3$ to 0.9 $g/cm^3$.

Figure 4:
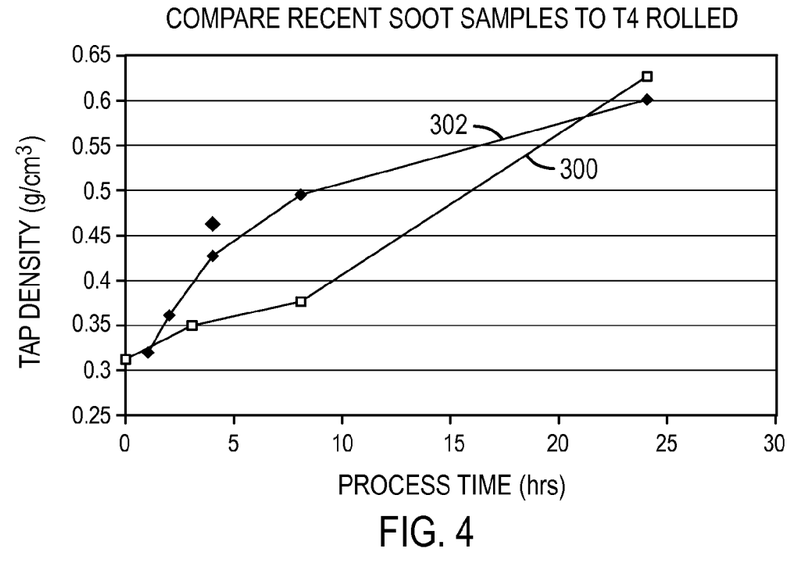
FIG. 4 is a graph of tap density in relation to process time of one of the layers of the structure according to two types of processes.

FIG. 4 is a graph illustrating the tap density as a type of the as-formed fumed silica soot treated by either rolling the soot or mixing/shaking the soot within a Turbula mixer. Graph line 300 shows the tap density over time of the rolled soot. Graph line 302 shows the tap density over time of the soot processed in the Turbula mixer. As shown in the graph, the tap density in these exemplary embodiments increases from approximately 0.3 $g/cm^3$ to approximately 0.6 $g/cm^3$ over a 24 hour processing time.

In another exemplary embodiment, the as-formed soot is treated by the process of spray-drying a water-based slurry on the soot to form the agglomerated secondary soot particles. In the process of spray-drying the second fumed silica soot layer 30, as-formed fumed silica soot is dispersed in water, and thereafter, the water-dispersed silica soot is spray dried. As the slurry droplet dries, the primary soot particles form cohesive agglomerated particles that are similar to the droplet size injected into the drying environment. Each agglomerated particle includes primary particles compacted by the capillary forces of the drying water. The agglomerated particles are at least about 5 microns in diameter or greater, such as, for example, about 5 to 50 microns in diameter after spray-drying the fumed silica soot. In one exemplary embodiment, the agglomerated particles may be about 20 microns in diameter. The average surface area of the modified soot may range from about 15 $m^2/g$ to 100 $m^2/g$, and may, in an exemplary embodiment, be 23 $m^2/g$.

After spray-drying the soot having a surface area of 23 $m^2/g$, the tap density of the fumed silica soot can increase from an initial tap density ranging from about 0.1 $g/cm^3$ to 0.4 $g/cm^3$, such as, for example, about 0.3 $g/cm^3$, to a modified tap density ranging from about 0.8 $g/cm^3$ to 0.9 $g/cm^3$. The density of the individual agglomerate particles, after formation, may range from, for example, about 1.0 $g/cm^3$ to 1.4 $g/cm^3$, such as, for example, about 1.2 $g/cm^3$.

Thus, the soot that is processed to agglomerated form, such as, for example, by one of the previously described methods or by another method, may be modified to a tap density ranging from about 0.35 $g/cm^3$ to 0.9 $g/cm^3$, depending on the starting tap density of the soot and the process used to form the agglomerated particles.

While it is described with reference to the above exemplary embodiment that the first fumed silica soot layer 10 is compacted prior to providing the modified second fumed silica soot layer 30, in a further exemplary embodiment, the second fumed silica soot layer 30 may be provided about a first fumed silica soot layer 10 that is not previously compacted, and, as will be described in more detail below, is compacted in a single step such that the first fumed silica soot layer 10 and the second fumed silica soot layer 30 are compacted together.

As shown in the exemplary embodiment of FIG. 1E, after the second fumed silica soot layer 30, which has been treated by a process to form agglomerated secondary particles from smaller primary particles, is provided within the second pressing mold 200 surrounding the compacted first fumed silica soot layer 10, a third ram 40 having an opening 42 defined in a center thereof pre-compacts only the sidewalls 32 of the fumed silica soot of the second layer 30 about the first fumed silica soot layer 10. Thereafter, the third ram 40 is retracted.

Figure 1F:
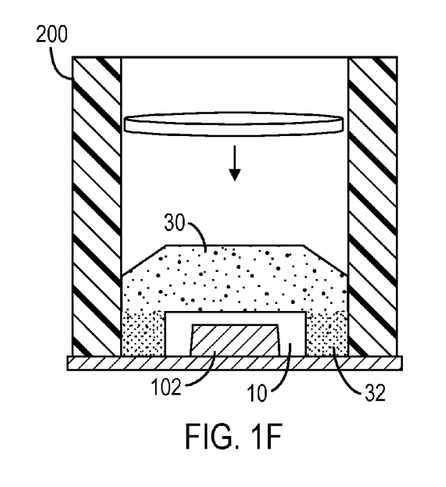
Figure 1G:
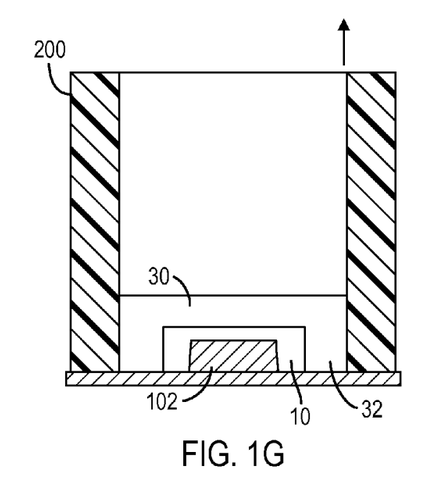
Figure 1H:
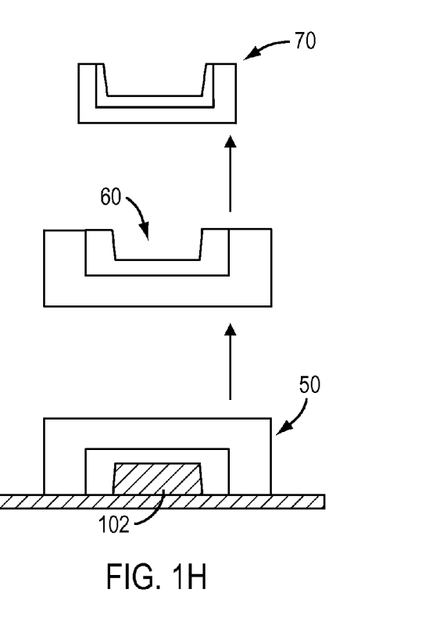

As shown in the exemplary embodiment of FIG. 1F, loose soot in the center redistributes about the center of the first soot layer 10 and at least partially across the compacted sidewalls 32, and a fourth ram 44, which is flat and does not include an opening defined therethrough, compacts the redistributed soot to a desired density. The fourth ram 44 compacts the outer layer 30 of fumed silica soot with pressures of about 100 psi to 900 psi, for example. As shown in the exemplary embodiment of FIG. 1G, the fourth ram 44 is retracted and the second pressing mold 200 may be removed, for example by disassembly or retraction.

After compaction, the agglomerated second soot layer 30 may, in various embodiments, be highly non-uniform in density due to the agglomerated particles retaining their shape during compaction. When relatively low compaction pressures are applied, such as for example about 100 psi to 150 psi for a 23 m²/g soot rolled for about 24 hours, interstitial voids between the large agglomerate particles may also be retained. The interstitial regions may be as large as about one-quarter the diameter of the agglomerate particles. The interstitial voids are formed in a compacted second fumed silica soot layer 30 comprised of a 23 m²/g soot rolled for about 24 hours, and pressed to about 130 psi range in diameter from less than 10 microns to nearly 100 microns. If higher pressures are used to compact the second soot layer 30 to a higher pressed density, the interstitial regions may be partially filled by agglomerate particles that have fractured under the load.

Thus, the second fumed silica soot layer 30 may, in various embodiments, be compacted to a pressed density ranging from about 0.6 g/cm³ to 1.2 g/cm³. For example, the pressed density for the second soot layer 30 for the rolled soot may be about 0.9 g/cm³ when a maximum pressure of 200 psi is applied, resulting in pore sizes ranging from about 1 micron to 50 microns. The pressed density for the second soot layer 30 for the rolled soot may be about 0.8 g/cm³ when a maximum pressure of 110 psi is applied, resulting in pore sizes ranging from about 10 microns to 100 microns. The pressed density for the second soot layer 30 for the shaken/mixed soot may be about 1.05 g/cm³ when a maximum pressure of 450 psi is applied, resulting in pore sizes ranging from about 1 micron to 20 microns. The pressed density for the second soot layer 30 for the shaken/mixed soot may be about 0.9 g/cm³ when a maximum pressure of 130 psi is applied, resulting in pore sizes ranging from about 10 microns to 100 microns. The pressed density for the second soot layer 30 for the spray dried soot may be about 1.12 g/cm³ when a maximum pressure of about 900 psi is applied, resulting in pore sizes ranging from about 2 microns to 15 microns.

Figure 5:
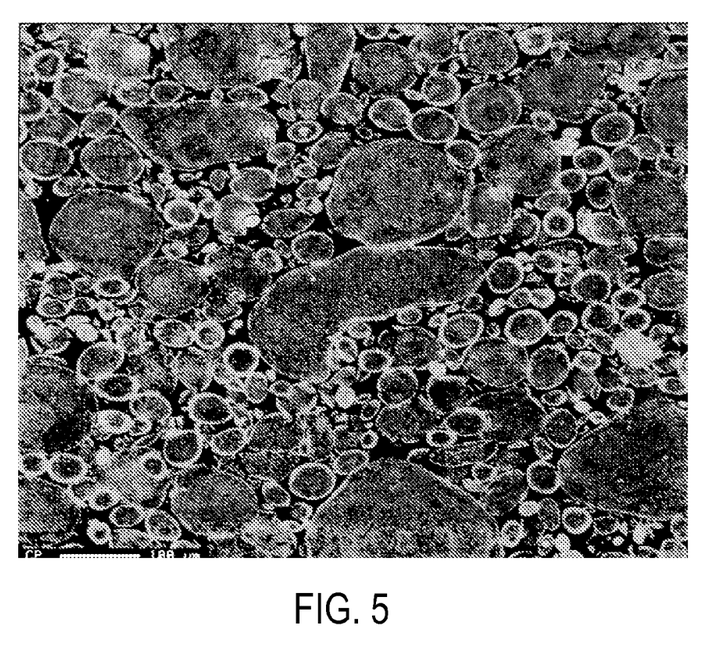
FIG. 5 is an image of one of the layers of an exemplary structure in a processed, compacted state according to one embodiment.

FIG. 5 is an image of exemplary processed rolled soot after being compacted. The structure includes agglomerate particles with interstitial void spaces formed between the agglomerate particles. The rolled agglomerate particles are compacted to a pressed density of 0.85 g/cm³, with agglomerates 25 microns to 250 microns in size. The individual agglomerate particles have a density of about 0.6 g/cm³ to 0.9 g/cm³. The interstitial pores range from 10 to 80 microns.

Figure 6:
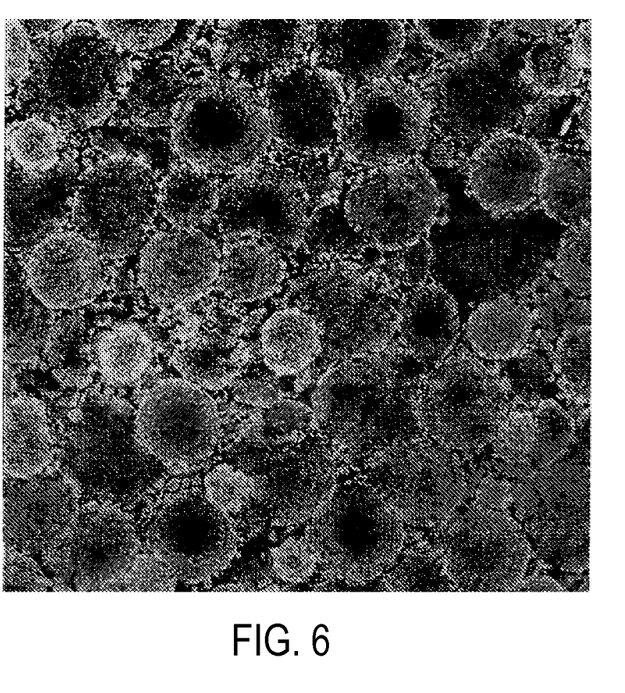
FIG. 6 is an image of one of the layers of an exemplary structure in a processed, compacted state according to another embodiment.

FIG. 6 is an image of exemplary processed shaken/mixed soot after being compacted. The rolled agglomerate particles are compacted to a pressed density of about 1.05 g/cm³, with agglomerates of about 60 microns to 120 microns in size, that have been fractured due to high pressure applied to achieve higher density. The individual agglomerate particles have a density of about 1.0 g/cm³. The interstitial pores range from about 2 microns to about 20 microns.

Figure 7:
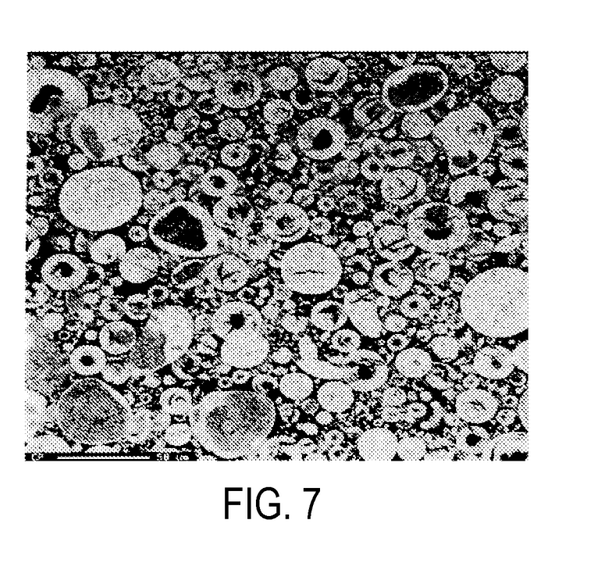
FIG. 7 is an image of one of the layers of an exemplary structure in a processed, compacted state according to yet another embodiment.

FIG. 7 is an image of exemplary processed spray dried soot after being compacted. The spray dried agglomerate particles are compacted to a pressed density of about 1.2 g/cm³, showing smaller average agglomerate particles and correspondingly smaller interstitial voids. The agglomerate particles are about 5 microns to 50 microns in size. The individual agglomerate particles have a density of about 1.0 g/cm³ to 1.2 g/cm³. The interstitial pores range from about 2 microns to 15 microns.

According to one exemplary embodiment, one or both of the first soot layer 10 and the second soot layer 30 may be compacted in an axial direction with respect to a central axis of the first pressing mold 100 and a central axis of the second pressing mold 200. According to another exemplary embodiment, one or both of the first soot layer 10 and the second soot layer 30 may be compacted in a radial direction with respect to a central axis of the first pressing mold 100 and a central axis of the second pressing mold 200.

The pressed density of the first soot layer 10 and the second soot layer 30 may, in certain embodiments, be determined during compaction. By way of example only, the pressed density in an axial pressing method may be determined by measuring a compaction distance of the first soot layer 10 or the second soot layer 30 using a distance sensor. For example, based on the amount of soot provided within a given area in the first well mold 100 or the second well mold 200, the vertical compaction distance from an un-compacted level of the soot to a compacted level of the soot within the respective mold allows for a real time calculation of the soot volume and a resultant calculation of the soot density. Alternatively, for both axial and radial processes, a pressure sensor can be used to estimate the compaction density from a calibrated load displacement curve previously generated for the soot.

Figure 8:
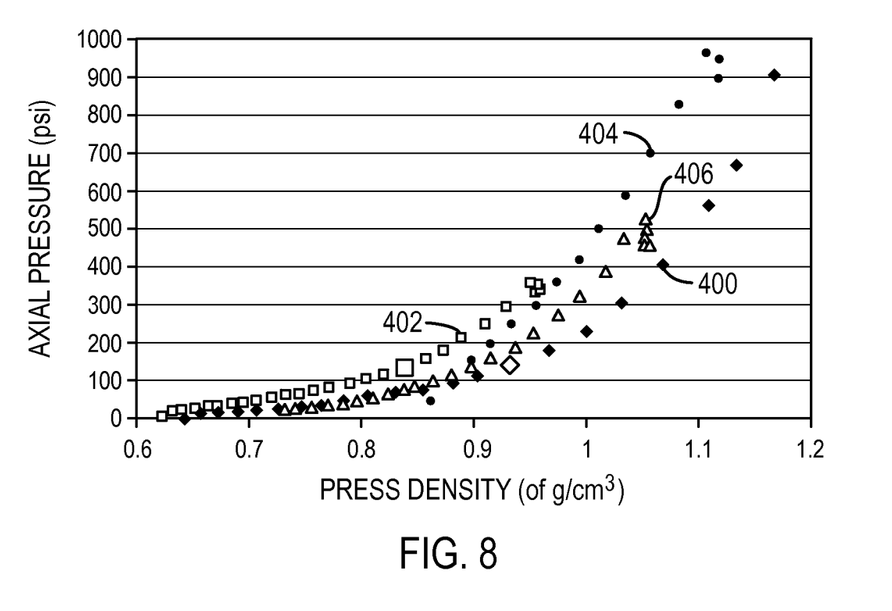
FIG. 8 is a graph of axial pressure in relation to press density for at least one of the layers of an exemplary structure.

FIG. 8 is a graph of axial pressure in relation to pressed density for various soot examples. Graph lines 400 and 402 illustrate two examples of axial pressure in relation to pressed densities for two types of as-formed soot, which may be used in the first soot layer 10. Graph line 404 illustrates an example of axial pressure in relation to pressed densities for spray dried soot, which may be used in the second soot layer 30. Graph line 406 illustrates an example of axial pressure in relation to pressed densities for soot that has been shaken/mixed in a Turbula mixer for about 24 hours, which may be used in the second soot layer 30.

Graph lines 400 and 402 shown in FIG. 8 illustrate that different pressed densities may be achieved for different types of soot at the same applied pressure. The pressed density that is achieved is dependent on, for example, soot surface area (e.g., a higher surface area leads to a lower density at the same pressure), the hydration level (e.g., more hydrated soot compacts more easily), and contaminant levels for the specific soot. Thus, a specific type of soot may be selected for use in either of the first soot layer 10 or the second soot layer 30 in order to optimize the pressure required for a targeted porosity of the second soot layer 30. As an example, an easier-to-compress soot may be used for the first soot layer 10 with a more difficult to compress soot for the second soot layer 10 in order to arrive at a desired density difference while using the same pressure if, for example, the first layer 10 and the second layer 30 are compacted in one step at the same applied pressure, as will be discussed in more detail below.

One of ordinary skill in the art would understand that a number of different approaches may be used in the method and process of compacting the first soot 10 and second soot layers 30 of fumed silica soot, and are not limited to, for example, compacting the layers 10 and 30 within the first pressing mold 100 and the second pressing mold 200.

While it is shown and described to compact the first fumed soot layer 10 and the second fumed soot layer 30 separately, in at least one exemplary embodiment, the first fumed soot layer 10 and the second fumed soot layer 30 may be compacted together in a single step. For example, when the first fumed silica soot layer 10 and the second fumed silica soot layer 30 use a single soot source, then there is a similar load displacement relationship for the as-formed, unmodified soot and the modified soot.

In an embodiment when the same soot source is used for both the first soot layer 10 and the second soot layer 30, two separate compaction steps may compact each of the first soot layer 10 and the second soot layer 30 to the appropriate pressed densities for consolidation. However, when two different soot sources are used, the fumed silica soot used for the first soot layer 10 may compact to a higher pressed density at a given load than the fumed silica soot used for the second soot layer 30. Therefore, a single compaction of both the first layer 10 of fumed silica soot from a first source and the second layer 30 of fumed silica soot from a second source may occur to compact each of the layers to the appropriate pressed densities for consolidation. The surface area of the soot source, the level of humidity and where the soot is made may all influence load displacement characteristics of a particular soot source.

While it is shown and discussed in an exemplary embodiment to form the vessel structure 50 by providing the first fumed silica soot layer 10, compacting the first layer 10, then providing the second, modified fumed silica soot layer 30 and compacting the second layer 30, the embodiments are not limited thereto, and one of ordinary skill in the art would recognize that a second, modified fumed silica soot layer comprised of substantially agglomerated particles formed from smaller primary particles may be provided and compacted within a well mold, for example, prior to providing and compacting a first, unmodified fumed silica soot layer comprised of primary particles.

After the first soot layer 10 and second soot layer 30 have been compacted, the first soot layer 10 and the second soot layer 30 are consolidated together by a consolidation process, such as heating by sintering, for example, to form a unitary structure. As shown in the exemplary embodiment of FIG. 1H, the compacted body 50 including both the first soot layer 10 and the second soot layer 30 is de-molded from the well mold 102 and a vessel well 60 is defined within the first soot layer 10 where the well mold 102 was removed. Thereafter, the compacted body 50 is formed into a consolidated vessel structure 70 where the inner 10 and outer 30 layers are bonded together. Any method known to those of skill in the art for consolidating the compacted body 50 may be used, such as, for example, heating the compacted body 50 to an appropriate temperature, such as about 1400° C. or greater.

The desired thickness of the consolidated first fumed silica soot layer will depend, in part, on the desired application and desired properties associated therewith, including, but not limited to, density, conductivity, purity, and thermal insulation properties. In at least one exemplary embodiment, the first fumed silica soot layer may have a thickness prior to consolidation of about 0.8 cm, and a thickness after consolidating of about 0.5 cm or greater.

In consolidation through heating, for example, shrinkage of the compacted body 50 may occur from a specific size or thickness of each of the layers to a smaller consolidated structure 70 in which the size or thickness of each of the layers is smaller than prior to consolidation. The dimensions of the layer thickness may be defined by the application, but in general for molten silicon processing a inner layer wall thickness of greater than 3 mm is preferred to survive the normal dissolution of the silica into the molten silicon. Assuming isotropic shrinkage of the compacted inner layer during consolidation, the molded thickness, $t_m$, of the pressed soot can be estimated from the densities of the pressed soot ($\rho_m$) and the consolidated glass $\rho_c$ (=2.2 g/cm³ for the inner layer) and the target thickness of the consolidated layer, $t_c$, by the simple equation $t_m=t_c(\rho_c/\rho_m)^{1/3}$. The same relation is valid for the outer layer, except that the consolidated density will be lower. The more dense the layers are, the more shrinkage is reduced. Shrinkage may be dependent on the type of fumed silica soot used and/or the process used to form the agglomerated particles of the second soot layer 30.

The first 10 and second 30 soot layers can be consolidated to different consolidation densities. The first soot layer 10 may be fully dense after consolidation, i.e., having a density ranging from about 2.18 g/cm³ to 2.22 g/cm³, such as, for example, about 2.20 g/cm³. The first soot layer 10 after consolidation may be a relatively high purity fused silica with few or no pores. In at least some embodiments, a uniform character of the soot prior to consolidation may lead to uniform consolidation during thermal treatment.

Figure 9:
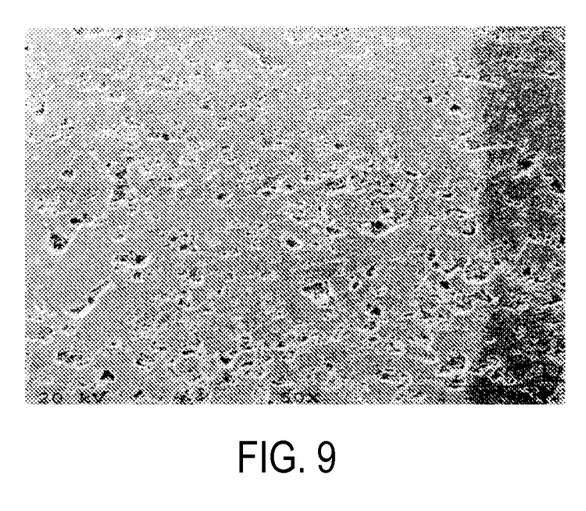
FIG. 9 is an image of one the layers of an exemplary structure after sintering according to at least one exemplary embodiment.

The second soot layer 30 may have a density ranging from about 1.65 g/cm³ to 2.15 g/cm³ after consolidation. After consolidation, the second soot layer 30 may retain remnant porosity from the large macropores in the compacted structure. During the heating process, dense agglomerate particles initially rapidly densify due to the high concentration of particles and the small radii of curvature of the small pores. The interstitial pores collapse more slowly and are retained after the heating process. The final density is characterized by the fraction of large pores within the fully dense agglomerate particles, as shown in the image of FIG. 9.

After consolidation, the second soot layer 30 may, in at least some embodiments, be opaque due to high levels of porosity that are retained in the glass from the agglomerate particles. The high porosity may promote lower thermal conductivity and better radiative absorption. The thermal conductivity scales inversely with porosity. The second soot layer 30 may be consolidated to a range from about 4 percent to about 25 percent porosity.

The consolidated density can be affected by the choice of pressed density for a given modified soot. Typically, the secondary agglomerate structure is not severely fractured when the soot is compacted to a density that is less than 0.25 g/cm³ higher than the tap density prior to compaction. Also, typically, the agglomerated structure is retained following compaction if the soot is compacted to a density that is less than 0.4 g/cm³ higher than the tap density prior to compaction. However, the interstitial voids are partially filled by some fractured material at pressures above about 0.25 g/cm³ higher than the tap density. Thus, lower pressures may result in less fractured agglomerated particles, which results in a greater retention of porosity after heating to consolidate the layers together.

Generally, a targeted level of porosity is to be achieved for the consolidated second soot layer 30, which will typically be used as an outer layer for a vessel that is designed to retain molten semiconducting material. Thus, a target porosity and associated target consolidation density is achieved for the second soot layer 30 by forming agglomerated soot and compacting the soot to a pressed density that is sufficiently high to form a cohesive compacted layer, but with an applied pressure that is low enough to retain the secondary agglomerate structure largely intact. When the applied pressure is not too high, the agglomerate particles are not crushed by too much pressurization, and the larger interstitial pore size and specific volume lead to greater retention of porosity in the consolidated state.

Based on the density and pressures required to achieve a targeted outer layer consolidated density, different process conditions for each soot and agglomeration process may be determined. For example, depending on the shrinkage that will occur after the layers are heated to consolidate them together, the first soot layer 10 may be compacted to a specific pressed density at a specific compaction pressure that would result in a pressed density of the first soot layer 10 that would provide the best shrinkage match with the second soot layer 30 to achieve the targeted consolidation density and porosity for the second soot layer 30. Further, in order to achieve the targeted consolidation density of the second soot layer 30, depending on whether the first soot layer 10 or the second soot layer 30 is compacted first, it may be preferable to use the lower of the two compaction pressures, if they differ, in the second compaction step or the layer that is compacted first may be overcompacted. Therefore, the first soot layer 10 may be compacted to a slightly higher pressed density than the second soot layer 30 in order to accommodate or offset the shrinkage effects that occur during the consolidation to glass, where the second layer 30 will consolidate to a lower consolidation density than the first layer 10.

Therefore, for example, to determine the pressure used, the pressed density to be achieved by the first soot layer 10 and the soot used, a second soot layer density may first be selected, based on the targeted macroporosity after consolidation to glass. In one example, if the pressed density of the second soot layer 30 is about 0.8 g/cm$^3$ in the rolled soot process, then, for example, it may be determined to first compact the first soot layer 10 to a pressed density of about 0.9 g/cm$^3$. In another exemplary example, if the pressed density of the second soot layer 30 is about 0.9 g/cm$^3$ in the Turbula mixer soot process, then, for example, it may be determined to first compact the first soot layer 10 to a pressed density of about 1.0 g/cm$^3$. In yet another example, because spray-drying forms higher density agglomerate particles, the second soot layer 30 compacts to a relatively high density at low pressure, and therefore, for example, it may be determined to only slightly exceed a second layer density of about 1.12 g/cm$^3$ with a density of about 1.15 g/cm$^3$ for the first soot layer 10.

Figure 10:
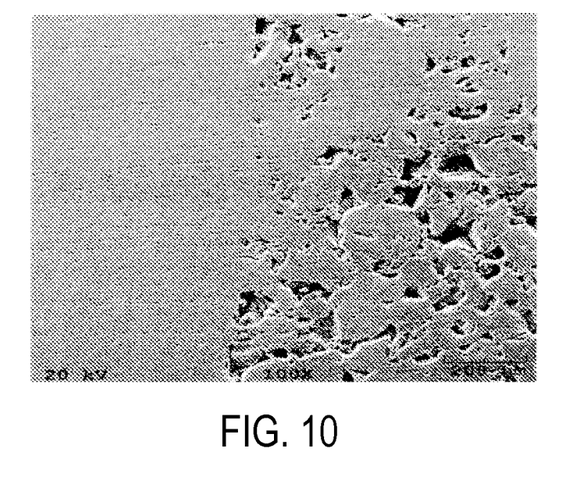
FIG. 10 is an image of two of the layers of an exemplary structure after sintering and consolidated according to at least one exemplary embodiment.

FIG. 10 is an image, which is a 100× micrograph, showing an interface between the first soot layer 10 and the second soot layer 30. The left side of FIG. 10 illustrates the dense area that results from the compacted first layer 10. The right side of FIG. 10 illustrates the large pores that result in interstitial voids from the modified and compacted second layer 10.

The consolidated vessel structure 70 is thereby formed, which may include a more porous first layer, which may be an inner layer of the vessel structure 70 and a less porous second layer, which may be an outer layer of the vessel structure. The consolidated vessel structure 70 may be used in, for example, receiving molten semiconducting material in order to contribute to the formation of solidified semiconducting material.

Unless otherwise indicated, all numbers used in the specification and claims are to be understood as being modified in all instances by the term "about," whether or not so stated. It should also be understood that the precise numerical values used in the specification and claims form additional embodiments. Efforts have been made to ensure the accuracy of the numerical values disclosed in the Examples. Any measured numerical value, however, can inherently contain certain errors resulting from the standard deviation found in its respective measuring technique.

As described herein, any methods having steps or processes that are recited may be performed in any order, unless explicitly stated otherwise, and still fall within the scope of the disclosure.

As used herein the use of "the," "a," or "an" means "at least one," and should not be limited to "only one" unless explicitly indicated to the contrary. Thus, for example, the use of "the process" or "process" is intended to mean at least one process.

Other embodiments will be apparent to those skilled in the art from consideration of the specification and practice of the disclosure set forth herein. It is intended that the specification and examples be considered as exemplary only, with a true scope and spirit of the invention being indicated by the claims.

What is claimed is:

1. A compacted structure, comprising:
    a first fused silica soot layer comprised of primary particles of fused silica soot, wherein the first fused silica soot layer is compacted from an initial density ranging from about 0.1 g/cm$^3$ to 0.4 g/cm$^3$ to a pressed density ranging from about 0.6 g/cm$^3$ to 1.2 g/cm$^3$; and
    a second fused silica soot layer comprised of agglomerated particles formed into an agglomerated form from primary particles of fused silica soot, wherein the second fused silica soot layer is formed over the first fused silica soot layer, and the second fused silica soot layer is compacted from a modified tap density ranging from about 0.35 g/cm$^3$ to 0.9 g/cm$^3$ to a pressed density ranging from about 0.6 g/cm$^3$ to 1.2 g/cm$^3$,
    wherein the primary particles of the first fused silica soot layer have a substantially uniform density distribution and the agglomerated particles of the second fused silica soot layer have a substantially non-uniform density distribution.

2. The compacted structure according to claim 1, wherein the second fused silica soot layer is modified by a process that increases an initial tap density ranging from about 0.1 g/cm$^3$ to 0.4 g/cm$^3$ of the fused silica soot of the second layer to the modified tap density ranging from about 0.35 g/cm$^3$ to 0.9 g/cm$^3$ in order to form the agglomerated particles.

* * * * *